(12) United States Patent
Hara et al.

(10) Patent No.: US 8,878,525 B2
(45) Date of Patent: Nov. 4, 2014

(54) POSITION DETECTOR

(75) Inventors: Tetsuya Hara, Kariya (JP); Yoshiyuki Kono, Obu (JP); Toru Shimizu, Nagoya (JP); Takamitsu Kubota, Chiryu (JP)

(73) Assignee: Denso Corporation, Kariya (JP)

( * ) Notice: Subject to any disclaimer, the term of this patent is extended or adjusted under 35 U.S.C. 154(b) by 189 days.

(21) Appl. No.: 13/552,895

(22) Filed: Jul. 19, 2012

(65) Prior Publication Data

US 2013/0033259 A1 Feb. 7, 2013

(30) Foreign Application Priority Data

Aug. 4, 2011 (JP) .................................. 2011-171063
Mar. 19, 2012 (JP) .................................. 2012-61813

(51) Int. Cl.
*G01R 33/06* (2006.01)
*G01R 33/07* (2006.01)
*G01D 5/14* (2006.01)

(52) U.S. Cl.
CPC .............. *G01D 5/145* (2013.01); *G01R 33/072* (2013.01)
USPC ................................ 324/207.22; 324/207.13

(58) Field of Classification Search
CPC ....... G01D 5/145; G01D 5/147; G01D 5/142; G01D 11/245; G01B 7/30; G01B 7/003; G01B 7/14; G01B 7/023

USPC ......................................... 324/207.22, 207.13
See application file for complete search history.

(56) References Cited

U.S. PATENT DOCUMENTS 6,496,002 B1    12/2002    Kogiso et al.

FOREIGN PATENT DOCUMENTS

| JP | 2000-321014 | 11/2000 |
| JP | 2003-177004 | 6/2003 |
| JP | 2009-204331 | 9/2009 |

OTHER PUBLICATIONS

Office Action (2 pgs.) dated Jun. 21, 2013 issued in corresponding Japanese Application No. 2012-061813 with an at least partial English-language translaton thereof (2 pgs.).

*Primary Examiner* — Reena Aurora
(74) *Attorney, Agent, or Firm* — Nixon & Vanderhye P.C.

(57) ABSTRACT

A permanent magnet is fixed to a stationary portion. A yoke made of magnetic material is provided to a rotating portion. The yoke is tube-shaped to surround the permanent magnet and has a chord portion into which a magnetic flux generated by the permanent magnet preferentially flows. The chord portion is arranged in such a manner as to be close to the permanent magnet. A Hall element is arranged at a specified position of the stationary portion relative to the permanent magnet 20. The Hall element outputs a signal which corresponds to a density and an angle of a magnetic flux generated between the chord portion and the permanent magnet.

12 Claims, 14 Drawing Sheets

POSITION DETECTOR

CROSS-REFERENCE TO RELATED APPLICATIONS

This application is based on Japanese Patent Applications No. 2011-171063 filed on Aug. 4, 2011, and No. 2012-61813 filed on Mar. 19, 2012, the disclosures of which are incorporated herein by reference.

TECHNICAL FIELD

The present disclosure relates to a position detector detecting a position of a detecting-subject.

BACKGROUND

A position detector detecting a position of a detecting-subject has been well known. For example, JP-2003-177004A shows a rotation angle detector which is provided with a Hall element, a permanent magnet, a yoke and the like. When the permanent magnet and the yoke which are provided on the detecting-subject rotate relative to the Hall element, a magnetic flux vector is varied. By detecting this variation in magnetic flux vector, the rotation angle position of the detecting-subject is detected.

In the above rotation angle detector, since the Hall element and the permanent magnet are independently provided on the detecting-subject, it is likely that a distance between the Hall element and the permanent magnet may be varied for each detector. Further, since the distance between the Hall element and the permanent magnet is relatively large, the detector is easily influenced by disturbance magnetic field. Furthermore, since this distance is necessary to be large in order to improve a linearity of output, a magnetic circuit becomes larger.

SUMMARY

It is an object of the present disclosure to provide a position detector which is able to reduce a difference in position detection accuracy due to an individual product difference.

A position detector detects a position of a detecting-subject. The position detector includes a stationary portion, a yoke, a magnetic flux generating portion, and a magnetism detecting portion. The magnetic flux generating portion is provided to one of the detecting-subject and the stationary portion. The yoke is provided to the other of the detecting-subject and the stationary portion. The yoke is made of magnetic material and is shaped tubular around the magnetic flux generating portion. The yoke has a magnetic flux introducing portion which is close to the magnetic flux generating portion so that the magnetic flux generated by the magnetic flux generating portion preferentially flows thereinto. The magnetism detecting portion is arranged at a specified position relative to the magnetic flux generating portion. The magnetism detecting portion outputs a signal which corresponds to a magnetic flux density and a magnetic flux angle generated between the magnetic flux introducing portion and the magnetic flux generating portion.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Multiple embodiments of the present invention will be described with reference to accompanying drawings.
[First Embodiment]

Figure 1:
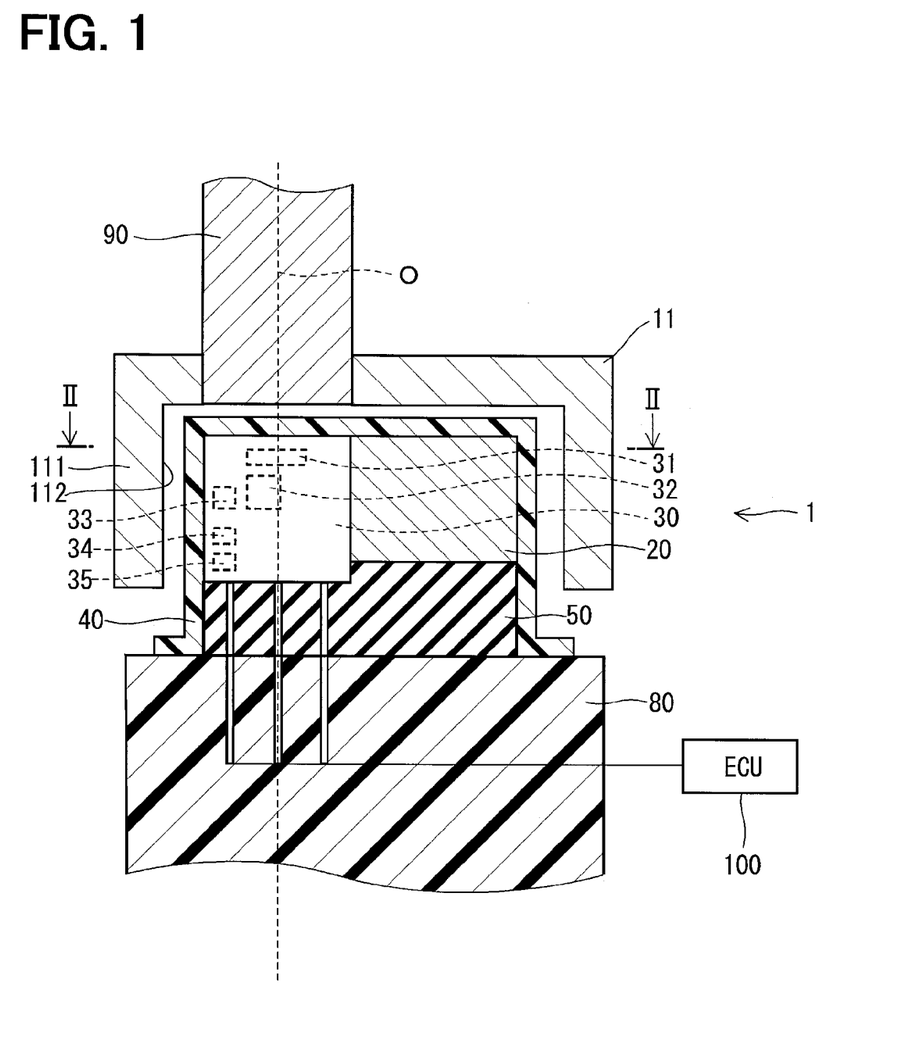
FIG. 1 is a cross sectional view of a rotation angle detector according to a first embodiment.

According to a first embodiment, a position detector is provided on a shaft of a throttle valve of a vehicle so that a rotation angle of the throttle valve is detected. The position detector is used as a rotation angle detector 1. As shown in FIG. 1, the rotation angle detector 1 is provided with a stationary portion 80, a yoke 11, a permanent magnet 20 and a Hall IC 30. The permanent magnet 20 functions as a magnetic flux generating portion.

The stationary portion 80 is fixed to a throttle body (not shown). The yoke 11 is formed cylindrical with magnetic material (refer to FIG. 2). The yoke 11 is connected to a rotating portion 90 in such a manner as to rotate with the rotating portion 90. This rotating portion 90 corresponds to a detecting-subject. The yoke 11 has a chord portion 111 which is flat shaped. The chord portion 111 is positioned inside of other inner wall surface of the yoke 11. The chord portion 111 corresponds to a magnetic flux introducing portion. The chord portion 111 has a flat surface 112 on its inner wall surface.

Figure 2:
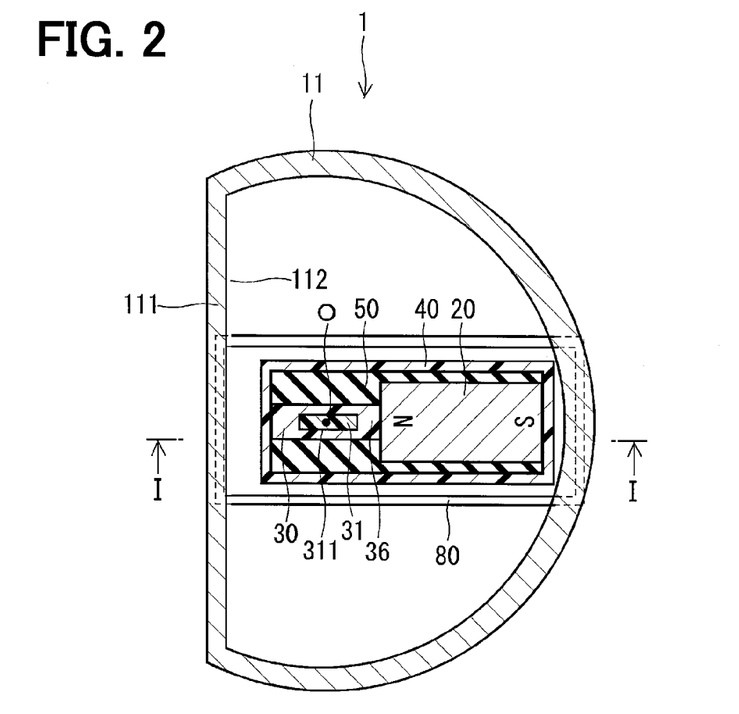
FIG. 2 is a cross-sectional view taken along a line II-II in FIG. 1.

As shown in FIGS. 1 and 2, the permanent magnet 20 and the Hall IC 30 are arranged inside of the yoke 11 and are fixed on the stationary portion 80. That is, the Hall IC 30 is arranged at a specified position relative to the permanent magnet 20. The permanent magnet 20 and the Hall IC 30 are sealed in a sensor cover 40 by a shock absorbing material 50 in such a manner as to be in contact with each other. The shock absorbing material 50 is formed from material having low elastic modulus. In the present embodiment, the shock absorbing material 50 is made from silicone rubber.

The Hall IC 30 includes a Hall element 31, a digital signal processor (DSP) 32 and a memory 33, as shown in FIG. 1. Further, as shown in FIG. 2, the Hall IC 30 includes an analog-to-digital conversion circuit (ADC) 34 and a digital-to-analog conversion circuit (DAC) 35, which are molded by molding material 36.

The Hall element 31 is formed by semiconductor membrane and has a magnetic sensing surface 311. The Hall element 31 outputs a signal corresponding to magnetic flux vector passing through the magnetic sensing surface 311. The Hall IC 30 is arranged in such a manner that a direction vertical to the magnetic sensing surface 311 is perpendicular to a magnetic flux which the permanent magnet 20 generates. The Hall element 31 corresponds to a magnetism detecting portion. The direction vertical to the magnetic sensing surface 311 corresponds to a magnetic sensing direction. The Hall element 31 is in contact with the permanent magnet 20 through the molding material 36. As shown in FIG. 2, the Hall IC 30 is arranged in such a manner that the Hall element 31 is disposed on an axis "O" of the rotating portion 90. When the direction vertical to the magnetic sensing surface 311 becomes perpendicular to a direction vertical to the flat surface 112, the output value of the Hall element 31 becomes zero.

The DSP 32 performs a correction processing and a rotational angle computing processing with respect to a digital signal from the Hall element 31. The memory 33 includes a read-only memory and a rewritable-memory which store various data which the DSP 32 uses.

An operation of the rotation angle detector 1 will be described hereinafter.

When the yoke 11 rotates about the axis "O" relative to the Hall element 31 and the permanent magnet 20, magnetic flux is generated. The Hall element 31 outputs a signal according to its magnetic flux density. The ADC 34 converts an analog signal which the Hall element 31 outputs into a digital signal. This digital signal is transmitted to the DSP 32. This digital signal converted by the ADC 34 is referred to as an actual output value, hereinafter. The DSP 32 performs a correction processing and a rotational angle computing processing with respect to the actual output value. Moreover, the DSP 32 transmits the processing results to the DAC 35. The DAC 35 converts the digital signal into the analog signal. This analog signal is transmitted to an electronic control unit (ECU) 100.

Figure 3:
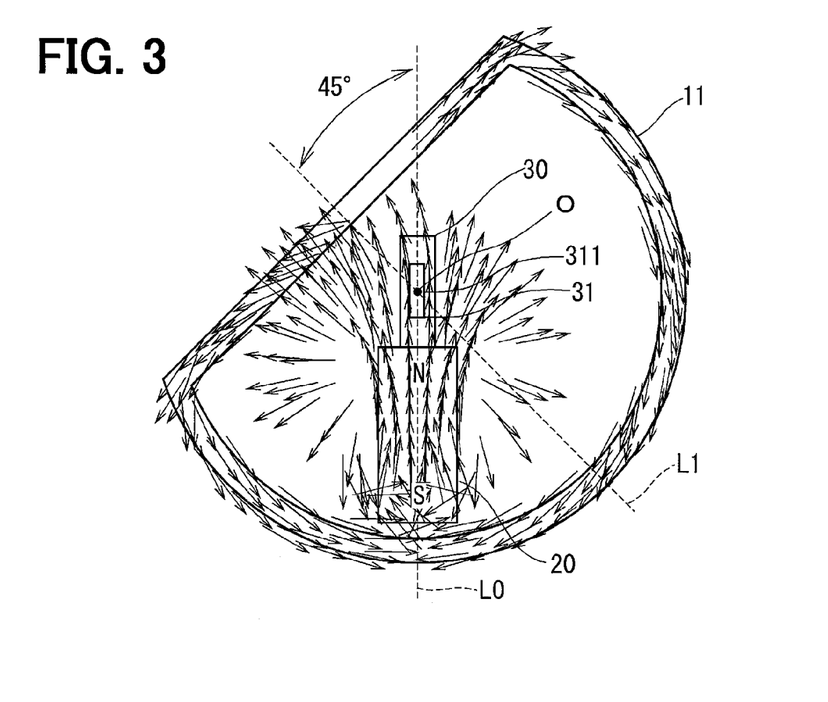
FIGS. 3, 4 and 5 are schematic views showing a magnetic flux density according to the first embodiment.
Figure 4:
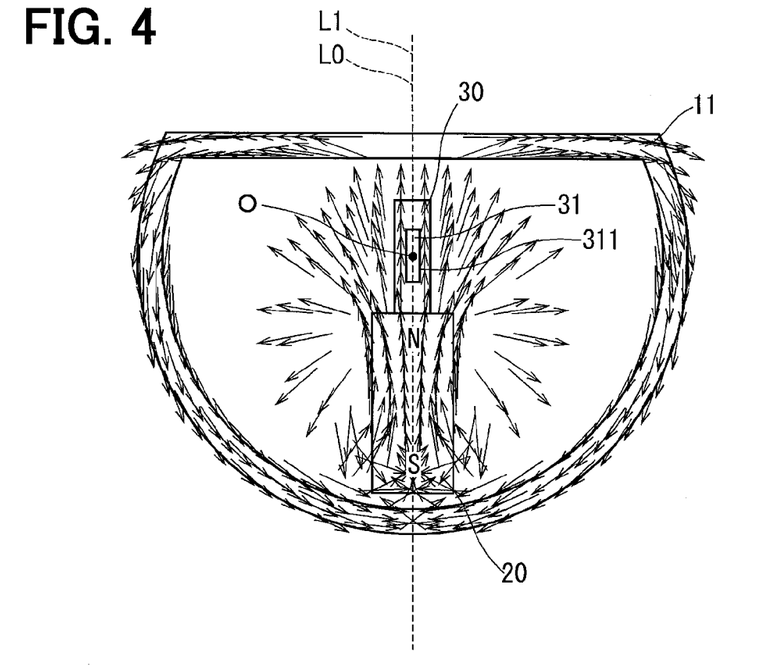
Figure 5:
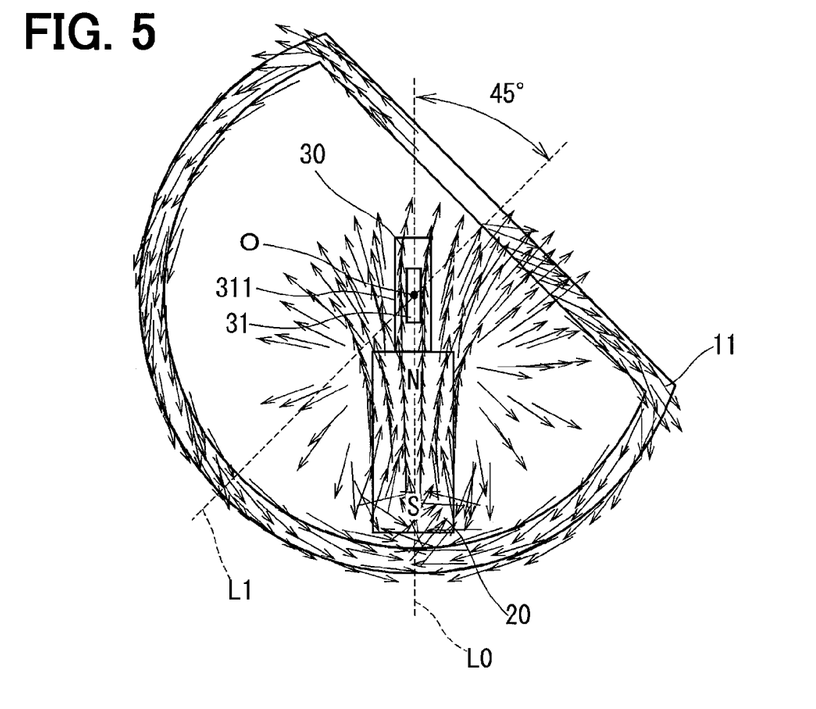

FIGS. 3 to 5 show the magnetic flux vector of when the rotation angle detector 1 is ON. In FIGS. 3 to 5, an arrow indicates a direction of the magnetic flux. A line which passes through the axis "O" of the yoke 11 and is perpendicular to the flat surface 112 is defined as a first reference line L1. A line which passes through the axis "O" of the yoke 11 and is parallel to the magnetic sensing surface 311 is defined as a second reference line L2. FIG. 3 shows the magnetic flux vectors of when the yoke 11 rotates 45 degrees in the counter clockwise direction relative to the Hall element 31. FIG. 4 shows the magnetic flux vectors of when a relative rotational angle between the yoke 11 and the Hall element 31 is zero. FIG. 5 shows the magnetic flux vectors of when the yoke 11 rotates 45 degrees in the clockwise direction relative to the Hall element 31.

Besides, when the yoke 11 rotates in the clockwise direction relative to the Hall element 31, the relative rotational angle between the yoke 11 and the Hall element 31 is referred to as "positive angle". When the yoke 11 rotates in the counter clockwise direction relative to the Hall element 31, the relative rotational angle between the yoke 11 and the Hall element 31 is referred to as "negative angle".

Figure 6:
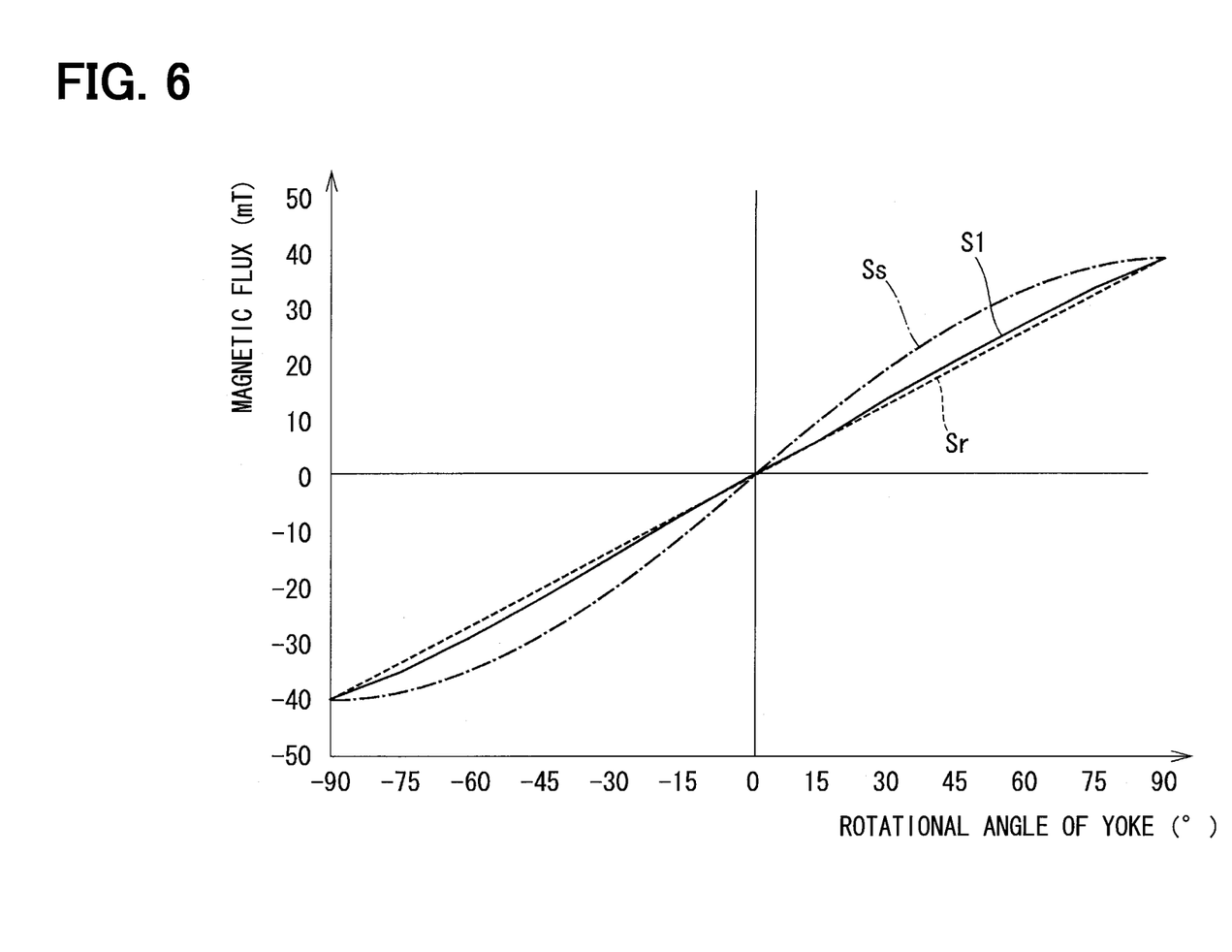
FIG. 6 is a graph showing an output of a Hall element according to the first embodiment.

FIG. 6 is a graph showing the output of the Hall element 31. In FIG. 6, a solid line S1 represents the actual output value of the Hall element 31, a dashed line "Sr" represents the ideal linear output value, and a dot-dash line "Ss" represent the ideal sine curve output value. As shown in FIG. 6, according to the present embodiment, the actual output value (S1) is close to the ideal linear output value (Sr).

Figure 7:
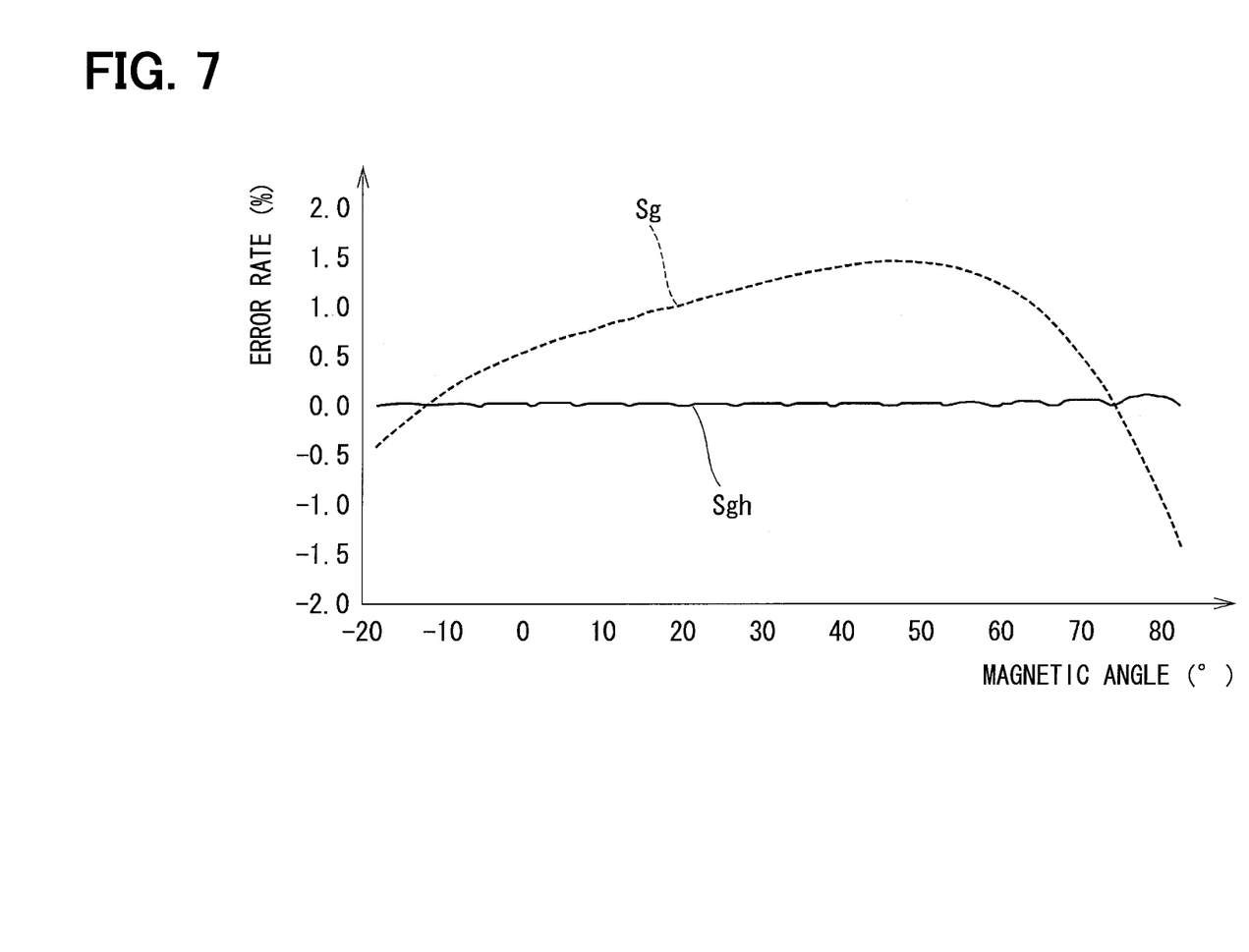
FIG. 7 is a graph showing an output error rate of the Hall element according to the first embodiment.

FIG. 7 is a graph showing a result of multi-point correction with respect to the actual output value. In FIG. 7, a curved line "Sg" represents an error rate of the actual output value, and a curved line "Sgh" represents an error rate of the actual output value that is corrected by the multi-point correction. As shown in FIG. 7, the error rate of the actual output value corrected by the multi-point correction is significantly decreased.

Advantages of the present embodiment will be described hereinafter.

(1) The permanent magnet 20 and the Hall IC 30 are fixed on the stationary portion 80. The position of the Hall IC 30 is regular relative to the position of the permanent magnet 20. Thus, it can be restricted that a distance between the permanent magnet 20 and the Hall element 31 is varied with respect to each product. A quality variation of each product can be reduced. Moreover, since the permanent magnet 20 and the Hall IC 30 are arranged inside of the yoke 11, the magnetic flux passing through the Hall element 31 less receives the influence from the disturbance magnetic field. Furthermore, when the distance between the permanent magnet 20 and the Hall element 31 is made shorter, the magnetic circuit can be made smaller.

(2) The permanent magnet 20 and the Hall IC 30 are in contact with each other. The Hall element 31 is in contact with the permanent magnet 20 through the molding material 36. The distance between the permanent magnet 20 and the Hall IC 30 is set to zero, whereby the distance between the permanent magnet 20 and the Hall element 31 is constant. Thus, when assembling the permanent magnet 20 and the Hall IC 30, it is restricted that the distance therebetween is varied due to an individual product difference. The quality variation of each product can be further reduced. Moreover, the magnetic circuit can be made smaller, whereby it can be restricted that the magnetic flux which the permanent magnet 20 generates is reduced. Furthermore, the magnetic flux passing through the Hall element 31 less receives influence from the disturbance magnetic field.

(3) The Hall IC 30 is arranged in such a manner that a direction vertical to the magnetic sensing surface 311 is perpendicular to a magnetic flux which the permanent magnet 20 generates. The Hall element 31 can detect the magnetic flux vectors of which directions are different from each other according to a variation in magnetic flux direction due to a relative movement between the Hall element 31 and the yoke 11. For this reason, the actual output value is positive value or negative value according to the relative movement between the Hall element 31 and the yoke 11. Therefore, in a case that the detection angle range includes an angle at which the actual output value is zero, the linearity of an actual output value can be improved.

(4) The chord portion 111 has the flat surface 112. The magnetic flux flows into the chord portion 111 along a direction which is vertical to the flat surface 112. Moreover, the density of the magnetic flux passing through the Hall element 31 and flowing into the chord portion 111 is uniformly varied due to the relative movement between the Hall element 31 and the yoke 11. Thus, the detection accuracy of the Hall element 31 can be enhanced.

(5) The Hall IC 30 and the permanent magnet 20 are covered with the shock absorbing material 50. Thus, the Hall IC 30 and the permanent magnet 20 are protected by the shock absorbing material 50. A variation in output of the Hall element 31 due to external stress can be avoided. Mechanical damages of the Hall element 31 and the permanent magnet 20 are also avoided.

(6) The Hall IC 30 and the permanent magnet 20 are fixed on the stationary portion 80. Thus, it is avoided that the Hall IC 30 and the permanent magnet 20 are damaged by external vibration.

(7) The Hall element 31 is arranged on the axis "O" of the rotating portion 90. The Hall element 31 detects only curved magnetic flux. The magnetic angle of the Hall element 31 is decreased relative to the rotation angle of the yoke 11. Thus, by arranging the Hall element 31 on the axis "O" of the rotating portion 90, a linear range of the actual output value can be made larger.

(8) By performing the multi-point correction of the actual output value, the detection accuracy can be improved.

[Second Embodiment]

Figure 8:
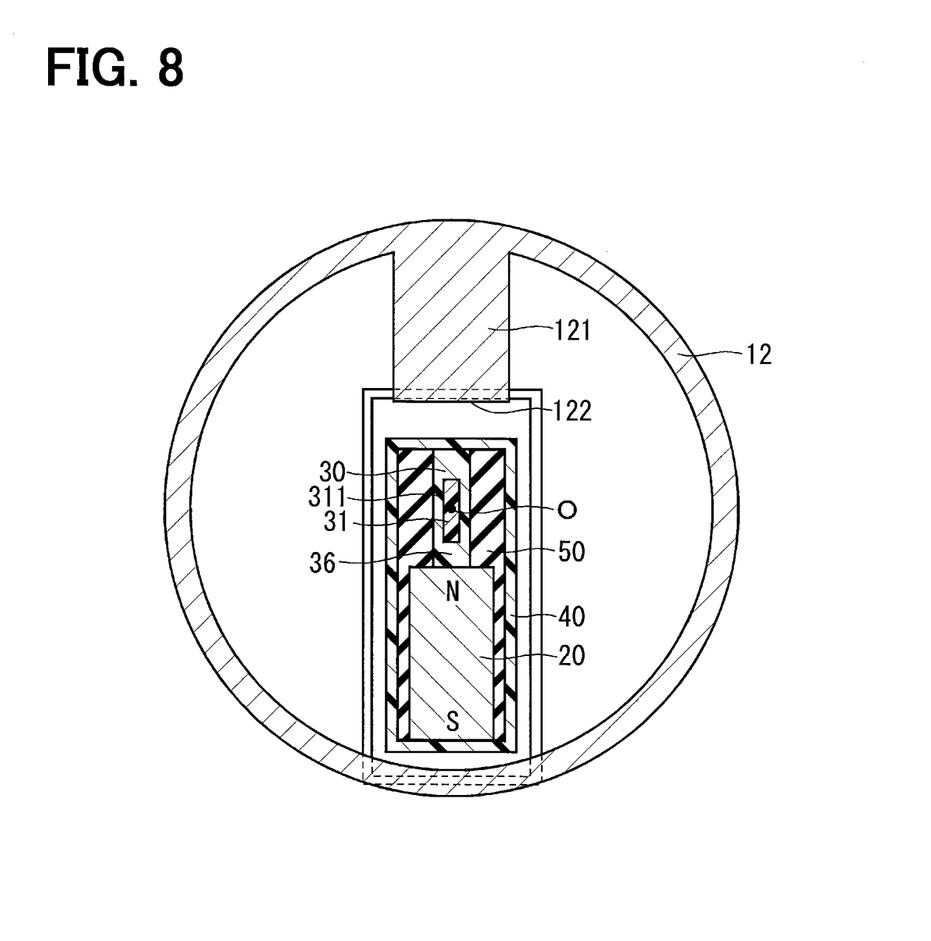
FIG. 8 is a cross sectional view of a rotation angle detector according to a second embodiment.

Referring to FIG. 8, a second embodiment of the present invention will be described hereinafter. In the second embodiment, the substantially same parts and the components as the first embodiment are indicated with the same reference numeral and the same description will not be reiterated.

As shown in FIG. 8, a yoke 12 of the rotation angle detector 2 is made cylindrical. The yoke 12 has a protruding portion 121 on its inner wall surface. This protruding portion 121 corresponds to a magnetic flux introducing portion. This protruding portion 121 has a flat surface 122 which confronts the Hall element 31. Also in the second embodiment, the same advantages as those in the first embodiment can be obtained.

[Third Embodiment]

According to a third embodiment, a position detector is applied to a stroke detector which detects a stroke amount of a stroke portion in a transmission, an accelerator or a brake of a vehicle.

Figure 9:
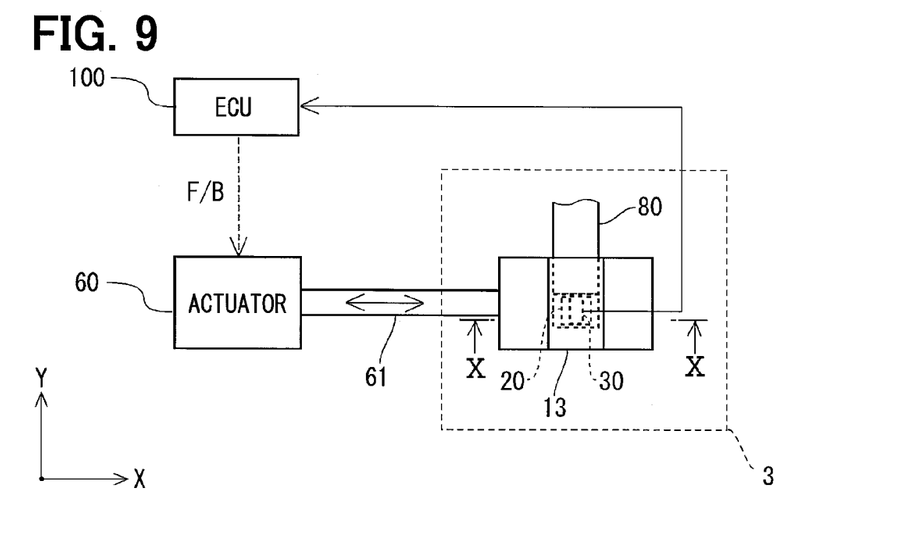
FIG. 9 is a cross sectional view of a stroke detector according to a third embodiment.

Referring to FIGS. 9 to 14, a stroke detector according to the third embodiment will be described hereinafter. As shown in FIG. 9, the stroke detector 3 transmits a signal to the ECU 100. This signal indicates a relative movement between a stroke portion 61 of a linear actuator 60 and the stationary portion 80. The ECU 10 computes a relative stroke amount of the stroke portion 61 relative to the stationary portion 80 based on the output signal of the stroke detector 3. The ECU 10 feedback controls the linear actuator 60. Hereafter, a stroke direction of the stroke portion 61 is referred to as X-direction, and a direction vertical to X-direction is referred to as Y-direction.

As shown in FIG. 9, the stroke detector 3 is provided with the stationary portion 80, a yoke 13, a permanent magnet 20, and the Hall IC 30. The configurations of the stationary portion 80, the permanent magnet 20 and Hall IC 30 is substantially the same as those in the first embodiment.

Figure 10:
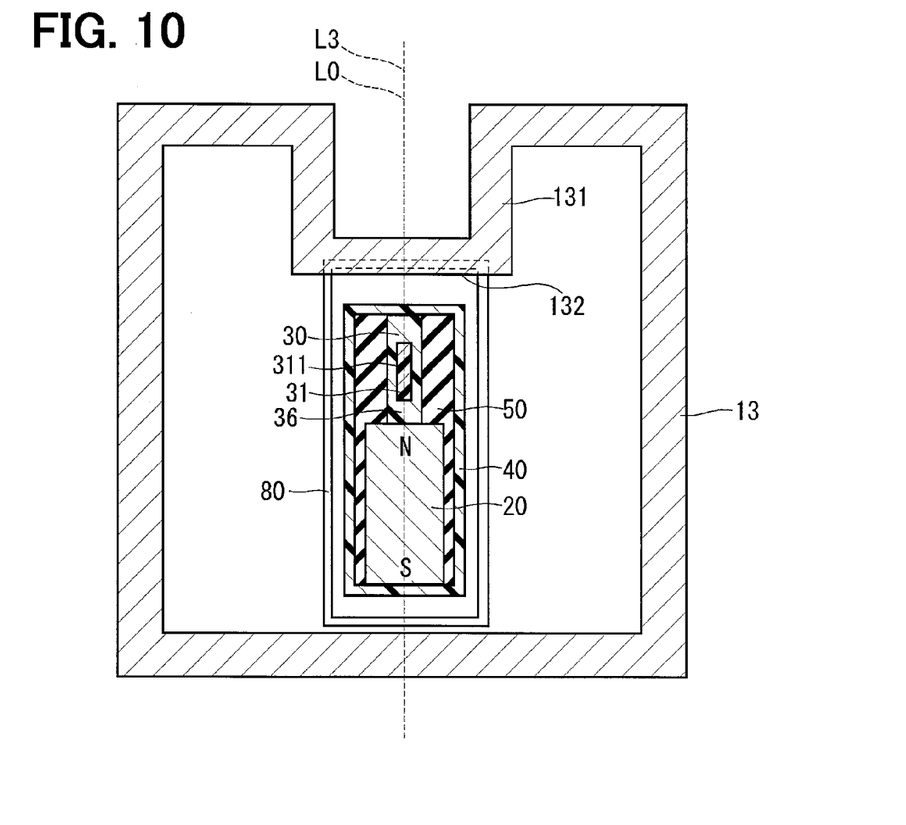
FIG. 10 is a cross-sectional view taken along a line X-X in FIG. 9.

The yoke 13 is connected to the stroke portion 61, which corresponds to a detecting-subject, and moves in X-direction along with the stroke portion 61. The yoke 13 is made from magnetic material and is tube-shaped. The yoke 13 has a protruding portion 131 on its inner wall surface. That is, as shown in FIG. 10, the cross section of the yoke 13 is "凹"-shaped. Further, the protruding portion 131 has a flat surface 132. This protruding portion 131 corresponds to a magnetic flux introducing portion.

Figure 11:
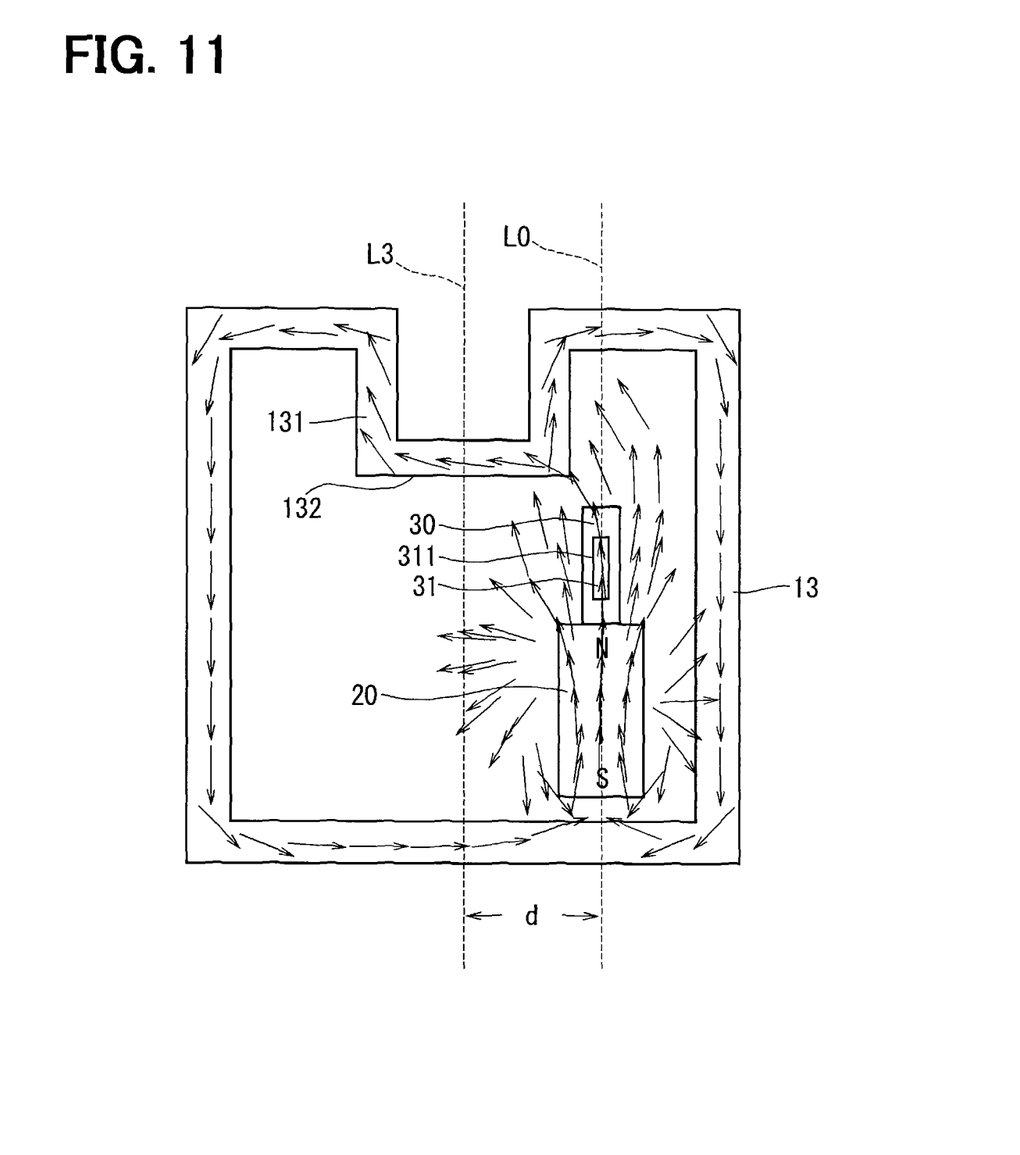
FIGS. 11, 12 and 13 are schematic views showing a magnetic flux density according to the third embodiment.
Figure 12:
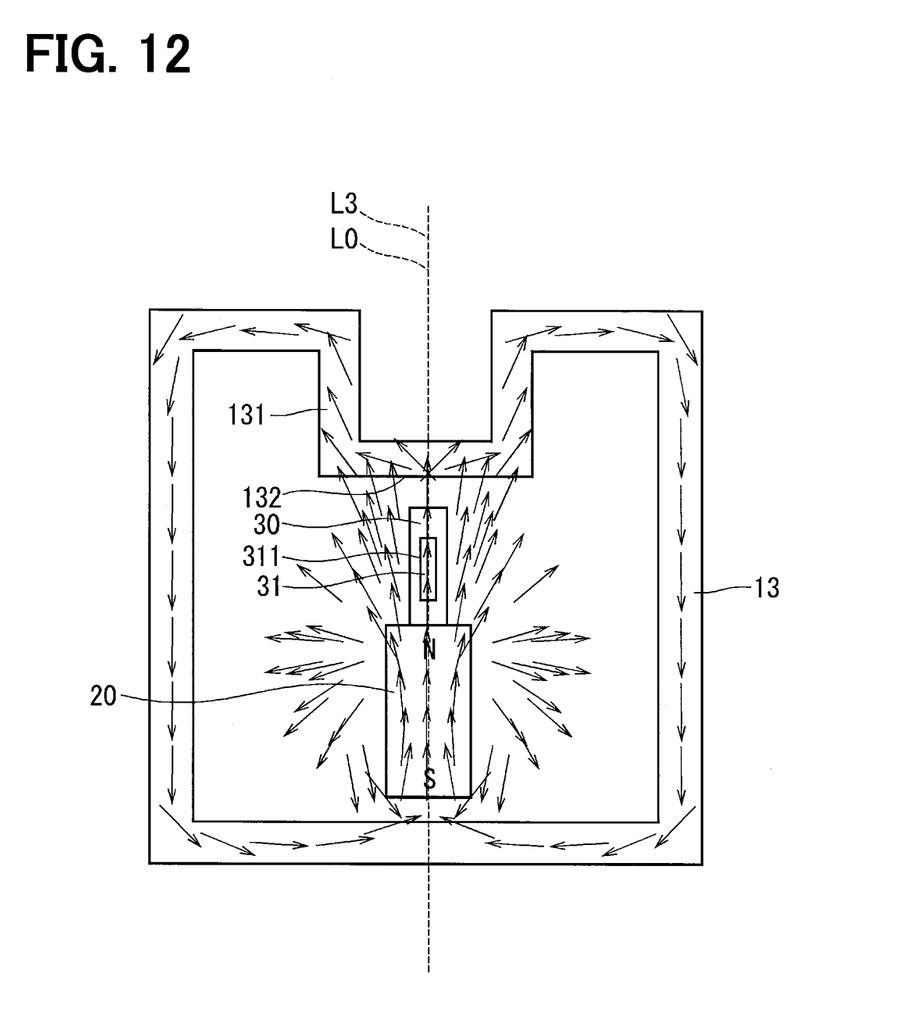
Figure 13:
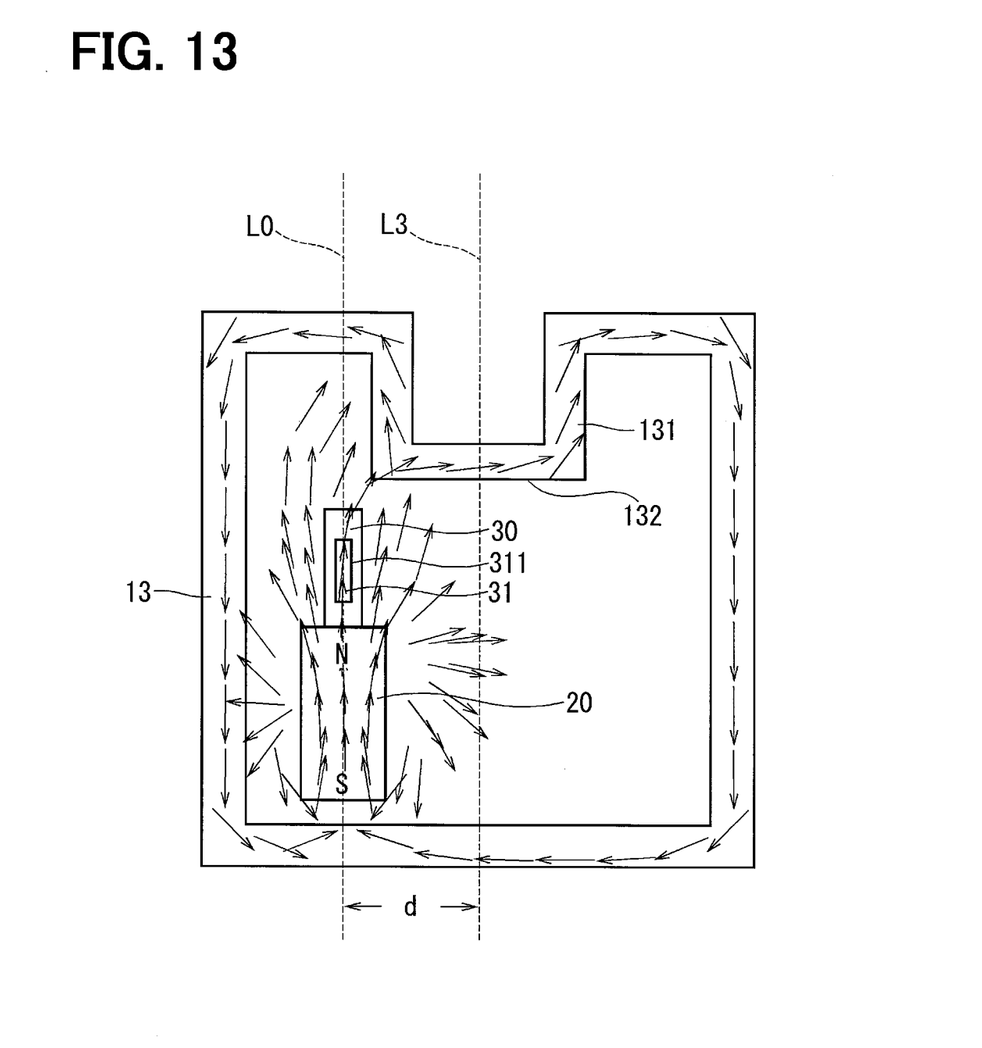

The permanent magnet 20 and the Hall IC 30 are connected to the stationary portion 80 in the yoke 13 in such a manner that the Hall IC 30 is positioned between the permanent magnet 20 and the flat surface 132. FIGS. 11 to 13 show magnetic flux vectors around the Hall element 31 of when the Hall IC 30 relatively moves relative to the yoke 13 in X-direction. A line passing through a mid point of the flat surface 132 and perpendicularly intersecting both X-direction and Y-direction is defined as a third reference line L3 of the yoke 13. FIG. 11 shows the magnetic flux vectors of when the yoke 13 moves leftward by a distance "d" in X-direction relative to the Hall IC 30. FIG. 12 shows the magnetic flux vectors of when a relative stroke amount between the yoke 13 and the Hall element 31 is zero. FIG. 13 shows the magnetic flux vectors of when the yoke 13 moves rightward by a distance "d" in X-direction relative to the Hall IC 30.

Figure 14:
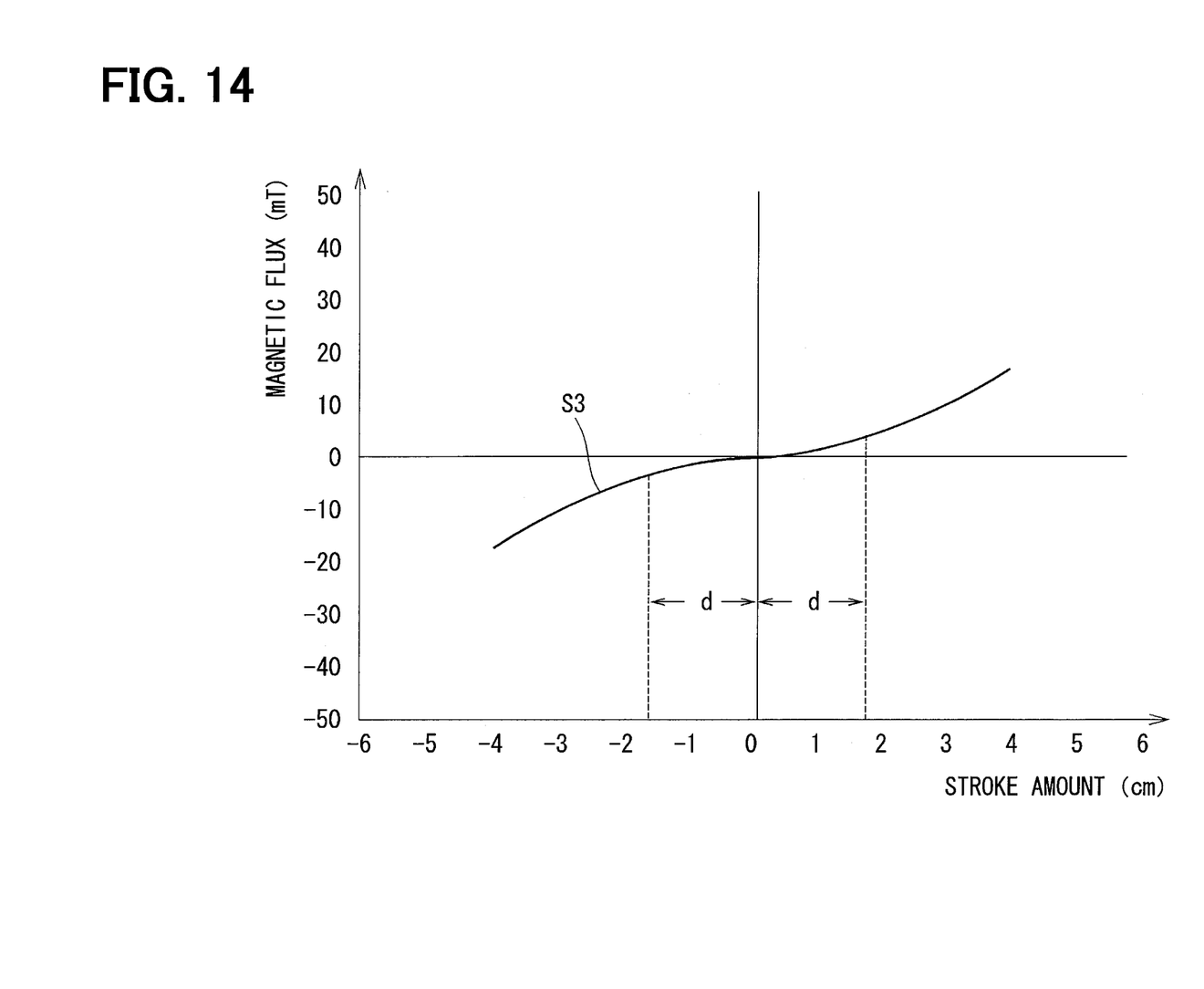
FIG. 14 is a graph showing an output of a Hall element according to the third embodiment.

The Hall IC 30 transmits a signal to the ECU 100. This signal indicates a relative movement between a stroke portion 61 of a linear actuator 60 and the stationary portion 80. FIG. 14 is a graph showing an output of the stroke detector 3. A solid line S3 represents an actual output value. When the Hall element 31 confronts the flat surface 132, the actual output value becomes zero. Besides, when the yoke 11 is positioned rightward relative to the Hall element 31, the relative stroke amount between the yoke 11 and the Hall element 31 is "positive value". When the yoke 11 is positioned leftward relative to the Hall element 31, the relative stroke amount between the yoke 11 and the Hall element 31 is "negative value". Also, the multi-point correction is performed with respect to the actual output value.

According to the present embodiment, the above advantages (1) to (6) and (8) of the first embodiment can be obtained.

[Fourth Embodiment]

Figure 15:
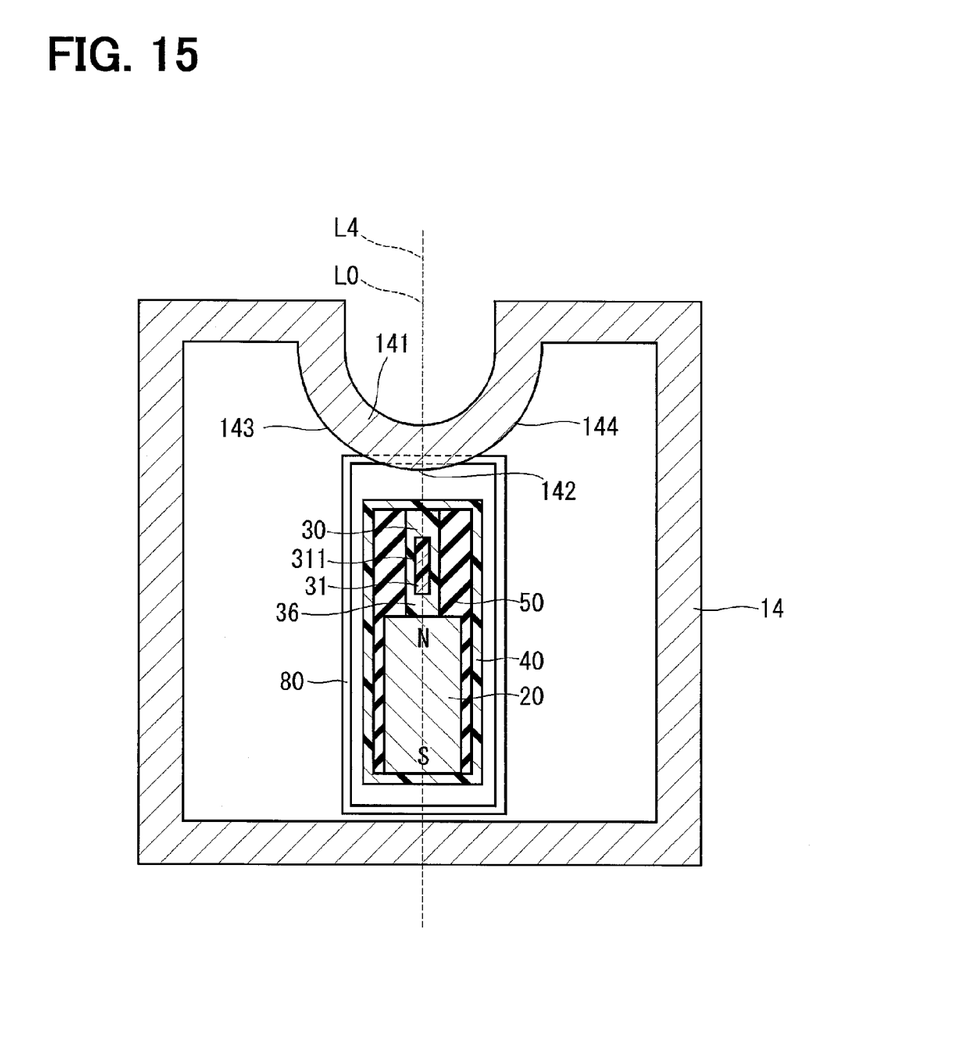
FIG. 15 is a cross sectional view of a stroke detector according to a fourth embodiment.
Figure 16:
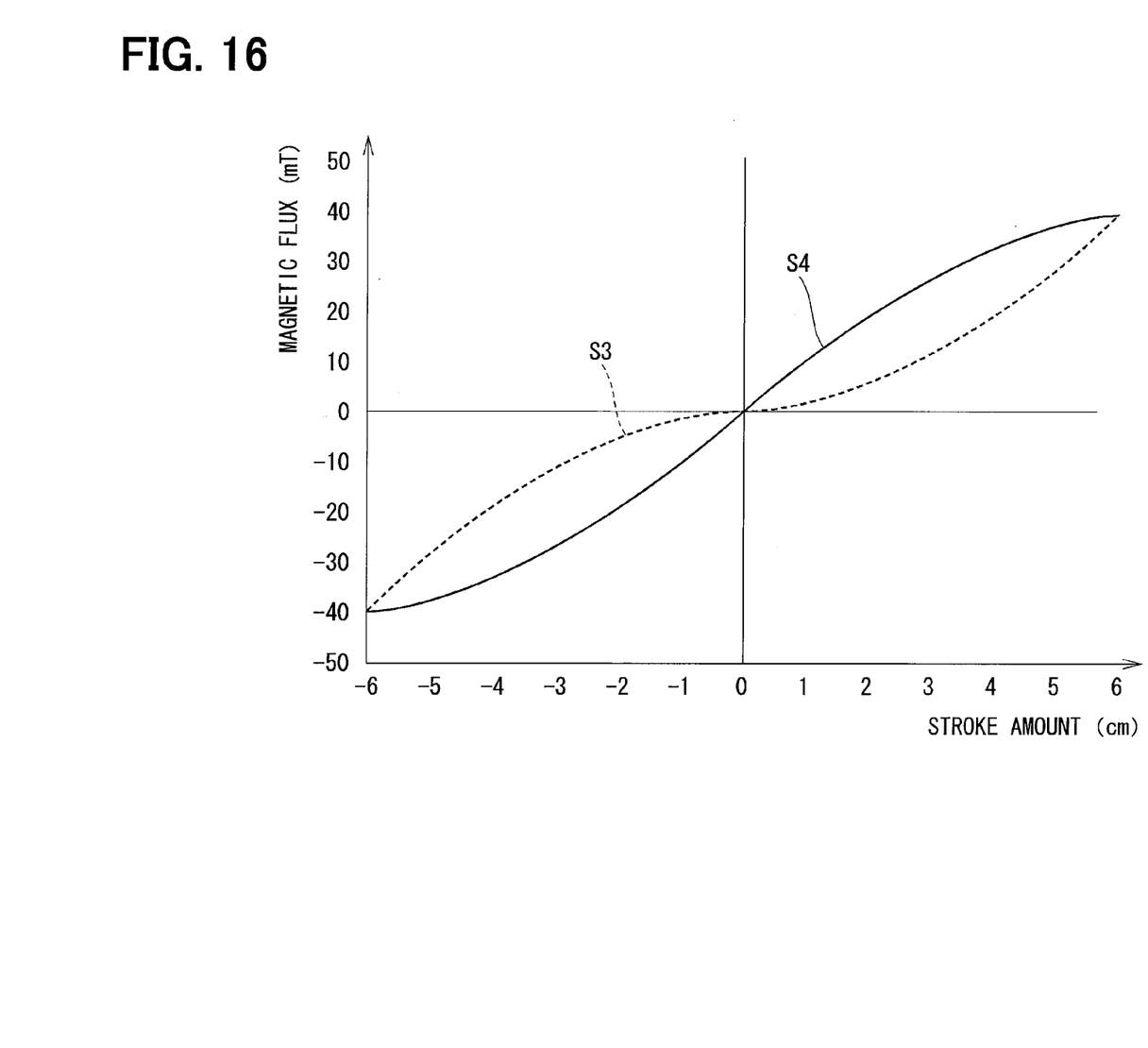
FIG. 16 is a graph showing an output of a Hall element according to the fourth embodiment.

Referring to FIGS. 15 and 16, a fourth embodiment of the present invention will be described hereinafter. In the fourth embodiment, the substantially same parts and the components as the third embodiment are indicated with the same reference numeral and the same description will not be reiterated.

As shown in FIG. 15, a yoke 14 of a stroke detector 4 is tube-shaped. Its cross section is substantially square. The yoke 14 has an arc-shaped protruding portion 141 on its inner wall surface. The protruding portion 141 has a top point 142, a first arc portion 143 and a second arc portion 144. A line passing through the top point 142 and perpendicularly intersecting both X-direction and Y-direction is defined as a fourth reference line L4 of the yoke 13. This protruding portion 141 corresponds to a magnetic flux introducing portion.

FIG. 16 is a graph showing an output of the stroke detector 4. A solid line S4 represents an actual output value according to the present embodiment. A dashed line S3 represents an actual output value according to the third embodiment. When the Hall element 31 confronts the top point 142, the actual output value becomes zero. That is, when the reference lines "L0" and "L4" overlap with each other, the actual output value becomes zero. A direction of the magnetic flux vector detected when the Hall element 31 confronts the first arc portion 143 is opposite to a direction of the magnetic flux vector detected when the Hall element 31 confronts the second arc portion 144. Thus, according to the fourth embodiment, a linearity of the actual output value can be enhanced more than the third embodiment.

[Fifth Embodiment]

Figure 17:
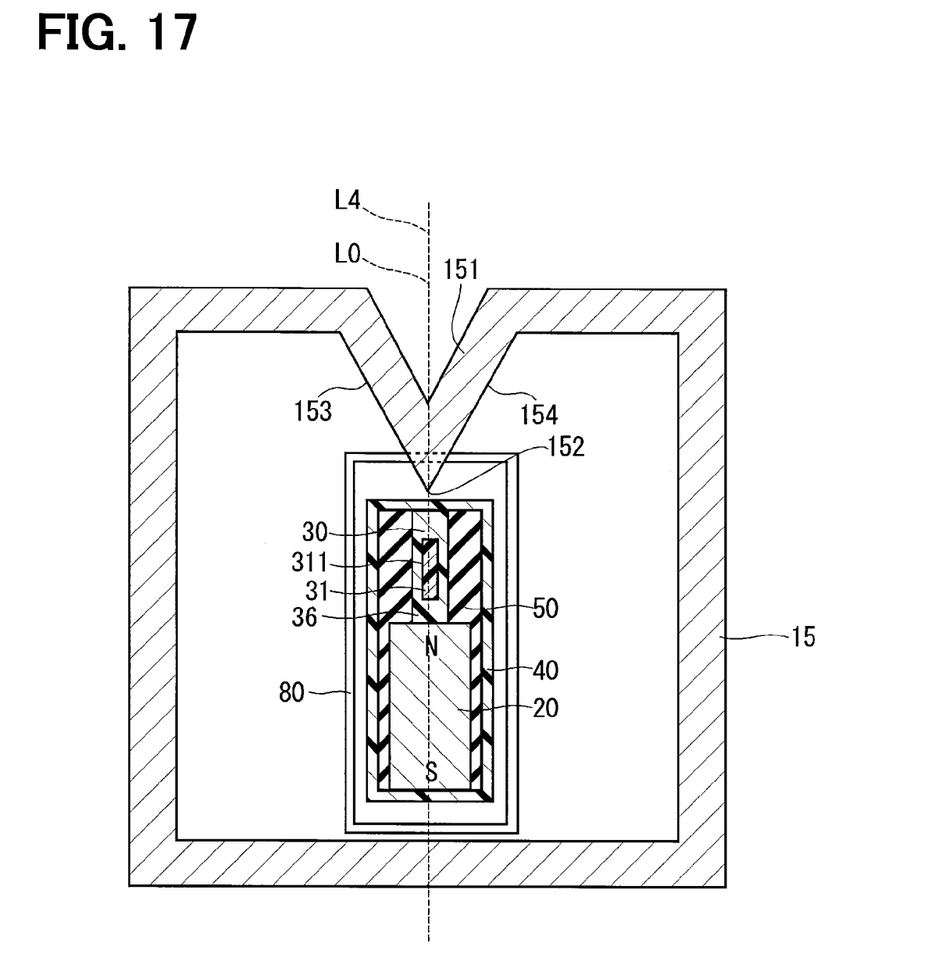
FIG. 17 is a cross sectional view of a stroke detector according to a fifth embodiment.

Referring to FIG. 17, a fifth embodiment of the present invention will be described hereinafter. In the fifth embodiment, the substantially same parts and the components as the third embodiment are indicated with the same reference numeral and the same description will not be reiterated.

As shown in FIG. 17, a yoke 15 of a stroke detector 5 is tube-shaped. Its cross section is substantially square. The yoke 15 has a V-shaped protruding portion 151 on its inner wall surface. The V-shaped protruding portion 151 has a top point 152, a first inclined portion 153 and a second inclined portion 154. A line passing through the top point 152 and perpendicularly intersecting both X-direction and Y-direction is defined as a fifth reference line L5 of the yoke 15. This protruding portion 151 corresponds to a magnetic flux introducing portion.

When the Hall element 31 confronts the top point 152, the actual output value becomes zero. That is, when the reference lines "L0" and "L5" overlap with each other, the actual output value becomes zero. A direction of the magnetic flux vector detected when the Hall element 31 confronts the first inclined portion 153 is opposite to a direction of the magnetic flux vector detected when the Hall element 31 confronts the second inclined portion 154. Also in the fifth embodiment, the same advantages as those in the fourth embodiment can be obtained.

[Other Embodiment]

In the above embodiments, the permanent magnet and the Hall IC are in contact with each other. However, the permanent magnet and the Hall IC are not always in contact with each other.

In stead of the permanent magnet, an electromagnet can be used. The shock absorbing material may be resin material.

Instead of the Hall element, a magnetoresistive element can be used. The Hall element and the permanent magnet may be directly in contact with each other.

The permanent magnet and the Hall IC may be arranged in such a manner that a direction of the magnetic flux generated by the permanent magnet is in parallel with a direction vertical to the magnetic sensing surface of the Hall element.

The yoke may be fixed to the stationary portion and the permanent magnet and the Hall IC may be provided on the detecting-subject.

The present invention is not limited to the embodiment mentioned above, and can be applied to various embodiments.

What is claimed is:

1. A position detector for detecting a position of a detecting-subject, comprising:
   a stationary portion;
   a magnetic flux generating portion provided to one of the detecting-subject and the stationary portion;
   a yoke provided to the other of the detecting-subject and the stationary portion, the yoke being made of magnetic material and being shaped tubular around the magnetic flux generating portion, the yoke having a magnetic flux introducing portion which is close to the magnetic flux generating portion so that magnetic flux generated by the magnetic flux generating portion flows thereinto; and
   a magnetism detecting portion arranged at a position relative to the magnetic flux generating portion, the magnetism detecting portion outputting a signal which corresponds to a magnetic flux density and a magnetic flux angle generated between the magnetic flux introducing portion and the magnetic flux generating portion, wherein
   the magnetism detecting portion has a magnetic sensing surface which senses a magnetism along a direction vertical to a direction of the magnetic flux generated by the magnetic flux generating portion.

2. A position detector according to claim 1, wherein:
   the magnetic flux generating portion and the magnetism detecting portion are arranged in such a manner as to be in contact with each other.

3. A position detector according to claim 1, wherein:
   the magnetic flux introducing portion has a flat surface inside of the yoke.

4. A position detector according to claim 1, wherein:
   the magnetic flux introducing portion has a protruding top point which protrudes toward inside of the yoke.

5. A position detector according to claim 1, wherein:
   the magnetic flux generating portion and the magnetism detecting portion are covered with a shock absorbing material.

6. A position detector according to claim 1, wherein:
   the magnetic flux generating portion and the magnetism detecting portion are fixed to the stationary portion.

7. A position detector according to claim 1, wherein:
   the detecting-subject relatively rotates relative to the stationary portion; and
   the magnetism detecting portion detects a relative rotational angle of the detecting-subject.

8. A position detector according to claim 7, wherein:
   the magnetism detecting portion is arranged on a rotation axis of the detecting-subject.

9. A position detector according to claim 1, wherein:
   the detecting-subject relatively linearly moves relative to the stationary portion; and
   the magnetism detecting portion detects a relative linear displacement of the detecting-subject.

10. A position detector according to claim 1, wherein the magnetic flux flows into the magnetic flux introducing portion along a direction which is vertical to a flat surface of the magnetic flux introducing portion.

11. A position detector according to claim 1, wherein a density of the magnetic flux passing through the magnetism detecting portion and flowing into the magnetic flux introducing portion is uniformly varied due to a relative movement between the magnetism detecting portion and the yoke.

12. A position detector according to claim 1, wherein the position at which the magnetism detecting portion is arranged is such that the magnetism detecting portion is configured to output the signal which corresponds to the magnetic flux density and the magnetic flux angle generated between the magnetic flux introducing portion and the magnetic flux generating portion.

* * * * *